United States Patent
Sakai et al.

(10) Patent No.: US 6,443,807 B1
(45) Date of Patent: Sep. 3, 2002

(54) POLISHING PROCESS FOR USE IN METHOD OF FABRICATING SEMICONDUCTOR DEVICE

(75) Inventors: Tetsuya Sakai; Yasuaki Tsuchiya, both of Tokyo (JP)

(73) Assignee: NEC Corporation, Tokyo (JP)

( * ) Notice: Subject to any disclaimer, the term of this patent is extended or adjusted under 35 U.S.C. 154(b) by 128 days.

(21) Appl. No.: 09/702,673

(22) Filed: Nov. 1, 2000

(30) Foreign Application Priority Data

Nov. 5, 1999 (JP) .......................................... 11-315560

(51) Int. Cl.[7] ................................................ B24B 1/00
(52) U.S. Cl. ............................................ 451/5; 451/37
(58) Field of Search .............................. 451/5, 6, 8, 41, 451/37, 285–288, 36

(56) References Cited

U.S. PATENT DOCUMENTS 6,132,292 A * 10/2000 Kubo .......................... 216/88
6,217,418 B1 * 4/2001 Lukanc et al. ................. 451/41
6,218,266 B1 * 4/2001 Sato et al. .................. 438/424
6,248,654 B1 * 6/2001 Lee et al. .................... 438/261
6,348,402 B1 * 2/2002 Kawanoue et al. ......... 438/618

FOREIGN PATENT DOCUMENTS

JP            10-296610         11/1998

* cited by examiner

Primary Examiner—Joseph J. Hail, III
Assistant Examiner—David B Thomas
(74) Attorney, Agent, or Firm—Young & Thompson

(57) ABSTRACT

First, in a primary polishing step, a substrate is brought into close contact with a first pad including abrasives and made of a hard material, and the first pad is rotated while a first solution containing no abrasive is supplied onto the first pad to polish a surface of the substrate. In the primary polishing step, since the first solution contains no abrasive and the first pad is hard, polishing is performed with high flatness and extremely less dishing and erosion. Next, in a secondary polishing step, the substrate is brought into close contact with a second pad including no abrasive and made of a soft material, and the second pad is rotated while a second solution containing abrasives is supplied onto the second pad to polish the surface of the substrate. In the secondary polishing step, since the second solution contains the abrasives and the second pad is soft, scratches produced in the primary polishing step are reduced.

28 Claims, 6 Drawing Sheets

POLISHING PROCESS FOR USE IN METHOD OF FABRICATING SEMICONDUCTOR DEVICE

BACKGROUND OF THE INVENTION

1. Field of the Invention

The present invention relates to a method of fabricating a semiconductor device, and more particularly to a method of fabricating a semiconductor device using CMP (Chemical mechanical Polishing).

2. Description of the Related Art

Conventionally, in a semiconductor device having a damascene structure, wirings and vias are formed using the Chemical Mechanical Polishing.

Typical wiring forming process in a method of fabricating a semiconductor device having the damascene structure is hereinafter described.

Figure 1A:
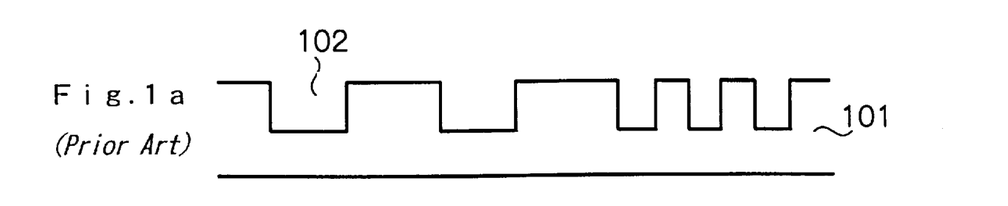
FIGS. 1a to 1e are diagrams showing a typical wiring forming process in a method of fabricating a semiconductor device having a damascene structure.

First, as shown in FIG. 1a, grooves 102 are formed in portions of oxide film layer 101 where wirings are to be formed.

Figure 1B:
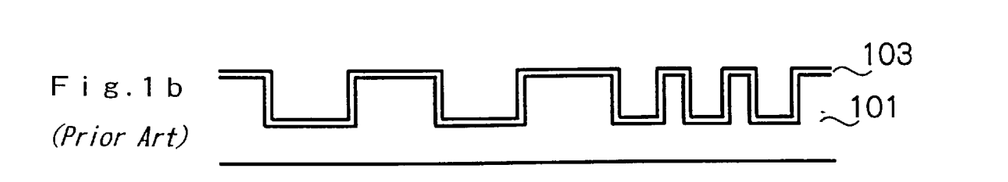

Next, as shown in FIG. 1b, barrier layer 103 made of tantalum is deposited on the entire surface of oxide film layer 101 including grooves 102 formed therein.

Figure 1C:
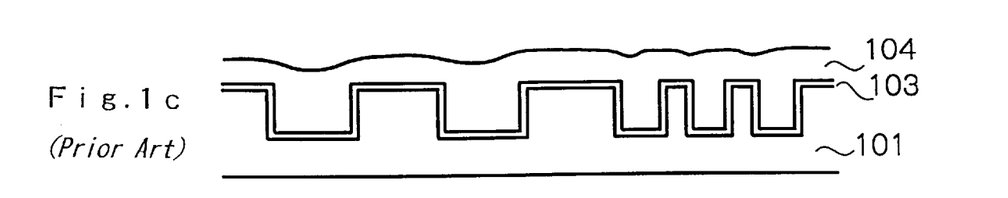

Then, as shown in FIG. 1c, conductive layer 104 made of Cu is deposited on the entire surface of barrier layer 103. The Cu is thus embedded in grooves 102.

Figure 1D:
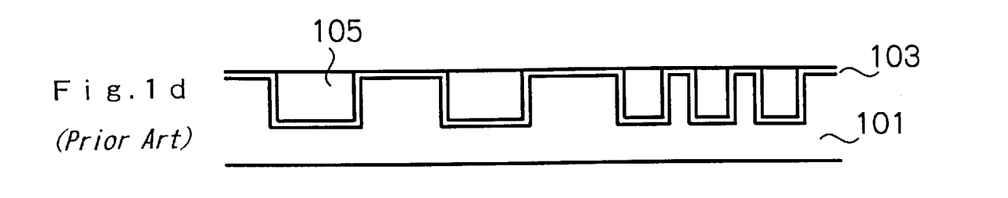

Next, conductive layer 104 is polished by performing primary polishing using the CMP to expose barrier layer 103 except for its portions on grooves 102. Thus, as shown in FIG. 1d, wirings 105 are formed in the portions where grooves 102 are formed.

Figure 1E:
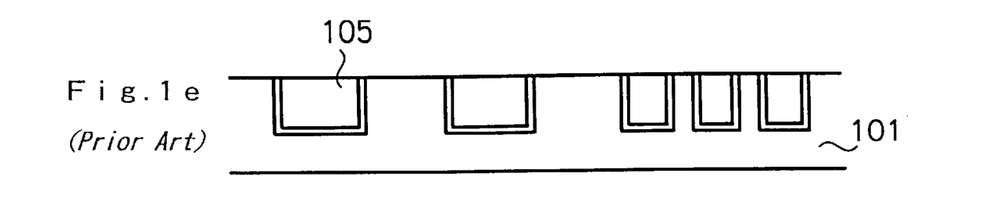

Secondary polishing using the CMP is then performed to remove barrier layer 103 except for the portions on grooves 102 as shown in FIG. 1e.

With the aforementioned series of steps, wirings 105 for the semiconductor device are formed.

Next, the polishing process using the CMP of the aforementioned steps are described in detail with reference to FIG. 2.

Figure 2:
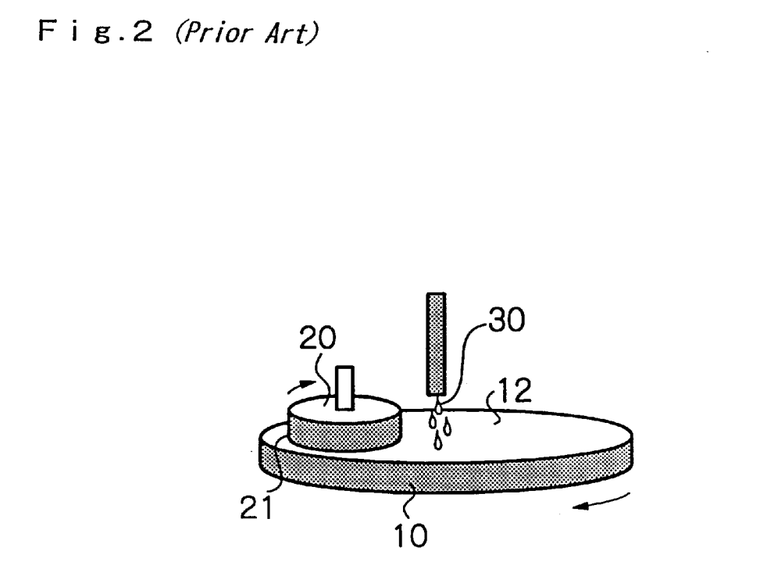
FIG. 2 is a diagram for describing an example of a method of polishing a semiconductor device using conventional CMP.

As shown in FIG. 2, support member 20 on which wafer 21 is mounted is brought into close contact with surface plate 10 having an upper surface on which urethane pad 12 is mounted such that urethane pad 12 is in contact with wafer 21. In this state, surface plate 10 is rotated while slurry 30 containing free abrasives is supplied onto urethane pad 12. In this manner, a surface of wafer 21 is polished. At this point, support member 20 also is rotated about the axis.

Typically, slurry containing alumina is used in the primary polishing in FIG. 1d. Slurry containing silica is used in the secondary polishing in FIG. 1e. This is because alumina provides a higher polishing speed than silica and is advantageous in removing Cu, while silica presents less occurrence of scratches on the wafer surface than alumina and is advantageous in removing tantalum.

Japanese Patent Laid-open Publication No.1998-296610 discloses a polishing method in which a fixed abrasive pad including abrasives embedded therein is used in stead of urethane pad 12 shown in FIG. 2 and a wafer surface is polished while slurry containing free abrasives is supplied onto the fixed abrasive pad. The amount of the abrasives contained in the slurry supplied onto the fixed abrasive pad is equal to or higher than 1% by weight.

The polishing method can realize high flatness of the wafer due to the use of the fixed abrasive pad. In addition, the supply of the slurry containing the abrasives can provide a higher polishing speed.

However, in a method of fabricating a semiconductor device using the polishing process as shown in FIG. 2, since the wafer surface is polished by the slurry supplied between the urethane pad and the wafer in the polishing steps, the abrasives in the slurry produce concave portions in the wafer surface, and the abrasives are introduced into the concave portions to further dig the concave portions.

Figure 3:
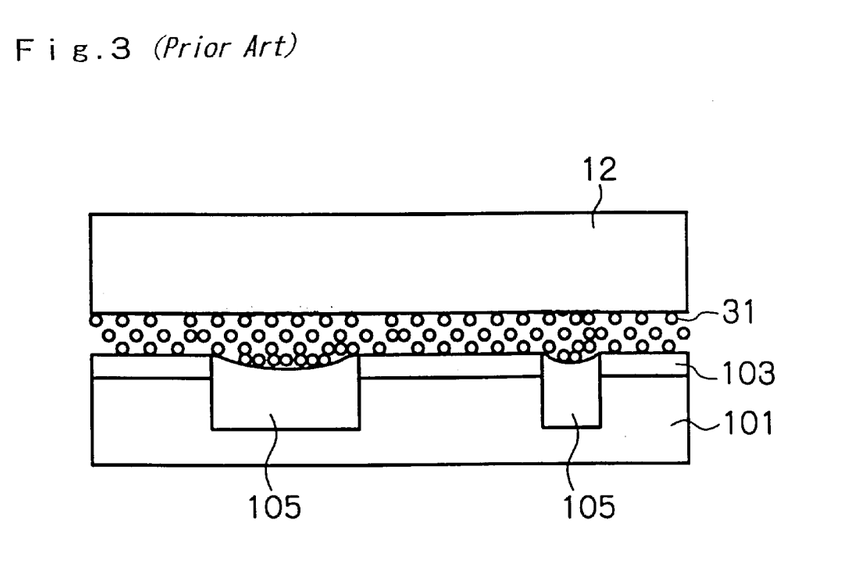
FIG. 3 is a diagram for describing the state of a wafer in a primary polishing step when a surface of the wafer is polished by supplying slurry between an urethane pad and the wafer.

As shown in FIG. 3, abrasives 31 in the slurry supplied between urethane pad 12 and wafer 21 are introduced into the concave portions produced in the surface of wafer 21 to further dig the concave portions. Since urethane pad 12 is made of a soft material, deformation occurs in portions of urethane pad 12 where many abrasives 31 in the slurry are introduced to cause more of the abrasives to be introduced into the concave portions in the surface of wafer 21, resulting in further digging of the concave portions.

In the secondary polishing step thereafter, the concave portions produced in the surface of wafer 21 in the primary polishing step are further dug similarly to the aforementioned manner.

Such digging leads to a problem that dishing or erosion produced on the wafer surface is increased to vary wiring resistance.

On the other hand, in the polishing method disclosed in Japanese Patent Laid-open Publication No.1998-296610, since the slurry containing the abrasives is supplied onto the fixed abrasive pad, the abrasives are introduced into concave portions produced in the wafer surface to further dig the concave portions, causing a problem similar to the aforementioned problem.

SUMMARY OF THE INVENTION

It is an object of the present invention to provide a method of fabricating a semiconductor device capable of suppressing variations in wiring resistance caused by dishing and erosion.

First, in a primary polishing step, a substrate is brought into close contact with a first pad including abrasives and made of a hard material, and the first pad is rotated while a first solution containing no abrasive is supplied onto the first pad to polish a surface of the substrate. In the primary polishing step, since the first solution contains no abrasive and the first pad is hard, polishing is performed with high flatness and extremely less dishing and erosion. However, many scratches occur on the polished surface of the substrate since the first solution contains no abrasive and the first pad includes the abrasives and is hard. Thus, in a secondary polishing step, the substrate is brought into close contact with a second pad including no abrasive and made of a soft material, and the second pad is rotated while a second solution containing abrasives is supplied onto the second pad to polish the surface of the substrate. In the secondary polishing step, the scratches produced in the primary polishing step are reduced since the second solution contains the abrasives and the second pad is soft.

With this method, the scratches produced on the substrate surface are reduced and the dishing or erosion produced on the substrate surface is suppressed to improve the flatness of the substrate surface.

When a substrate is brought into close contact with a pad including abrasives and the pad is rotated while a solution containing an abrasive whose content is 0.8% by weight or lower is supplied onto the pad to polish a surface of the substrate, the amount of the abrasives are introduced into concave portions in the substrate surface is reduced since the contained amount of the abrasives in the solution is 0.8% by weight or lower, thereby suppressing further digging of the concave portions.

The above and other object, features, and advantages of the present invention will become apparent from the following description with reference to the accompanying drawings which illustrate examples of the present invention.

BRIEF DESCRIPTION OF THE DRAWINGS

FIG. 6a is a diagram showing the state of a wafer in the primary polishing step for a semiconductor device shown in FIG. 4a;

DETAILED DESCRIPTION OF THE PREFERRED EMBODIMENTS

First Embodiment

Figure 4A:
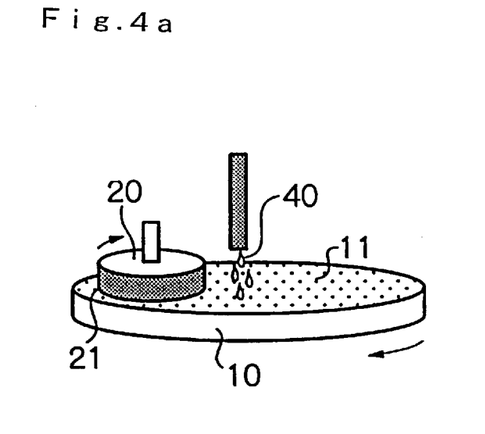
FIG. 4a is a diagram for describing a primary polishing step in a first embodiment of a method of fabricating a semiconductor device of the present invention.

In a first embodiment, in the first place, support member 20 on which wafer 21 is mounted is brought into close contact with surface plate 10 having an upper surface on which fixed abrasive pad 11 is mounted such that fixed abrasive pad 11 is in contact with wafer 21, as shown in FIG. 4a. Fixed abrasive pad 11 includes abrasives embedded therein and serves as a first pad. In this state, surface plate 10 is rotated while first solution 40 containing no free abrasive is supplied onto fixed abrasive pad 11 to polish a surface of wafer 21 until a barrier layer is exposed (primary polishing step). At this point, support member 20 also is rotated on the axis.

In this embodiment, a solution with a low etching rate which contains an organic acid such as a carboxylic acid or a sulfonic acid and water as principal components is used as solution 40. For end point detection in the primary polishing step, an optical or torque detection method is used.

Figure 4B:
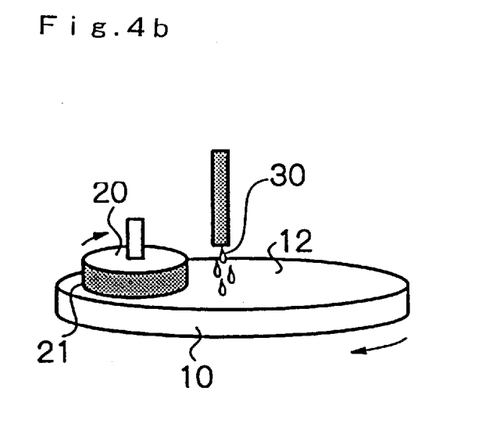
FIG. 4b is a diagram for describing a secondary polishing step in the first embodiment of the method of fabricating a semiconductor device of the present invention.

Next, as shown in FIG. 4b, support member 20 on which wafer 21 is mounted is brought into close contact with surface plate 10 having an upper surface on which urethane pad 12 serving as a second pad is mounted such that urethane pad 12 is in contact with wafer 21. In this state, surface plate 10 is rotated while slurry 30 serving as a second solution containing free abrasives is supplied onto urethane pad 12 to polish the surface of wafer 21 (secondary polishing step). The secondary polishing step is similar to the aforementioned conventional secondary polishing step.

Description is hereinafter made for a polishing apparatus for use in the polishing steps shown in FIGS. 4a, 4b.

Figure 5:
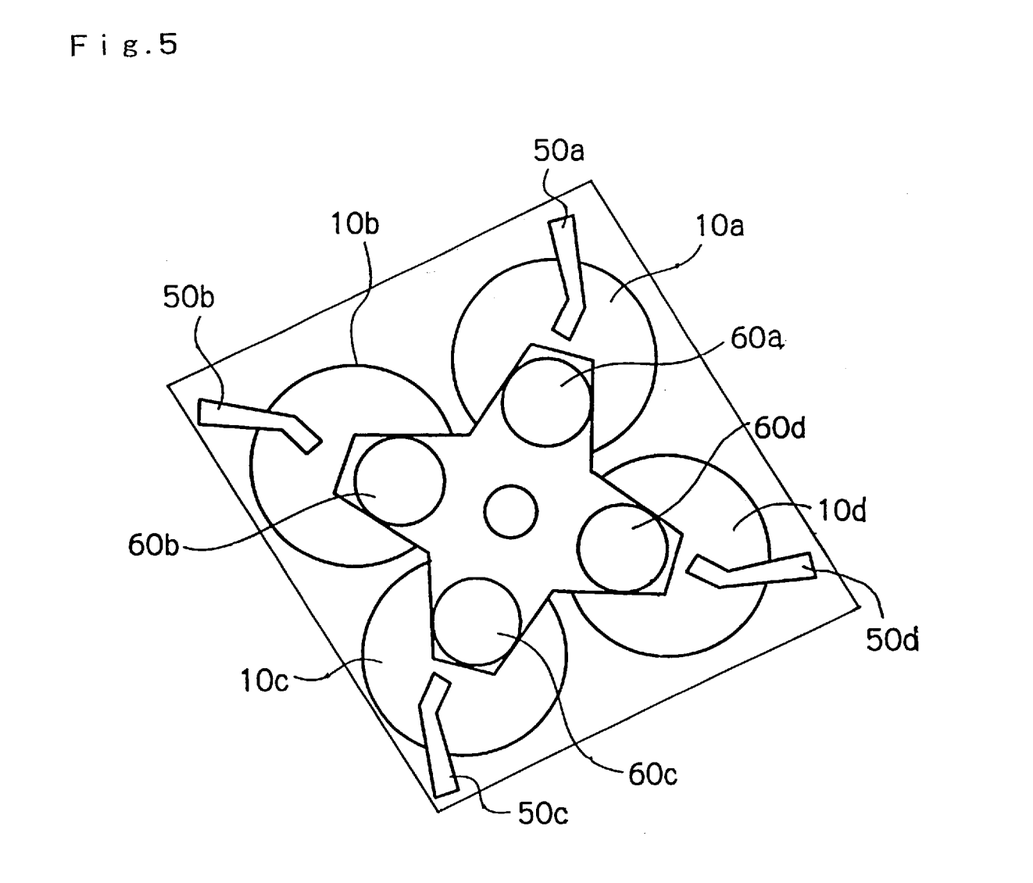
FIG. 5 is a diagram showing an example of a polishing apparatus for use in the polishing steps shown in FIGS. 4a, 4b.

The polishing apparatus for use in the embodiment comprises, as shown in FIG. 5, a plurality of surface plates 10a to 10d on which fixed abrasive pads 11 or urethane pads 12 are mounted, head portions 60a to 60d serving as support members 20 on which wafers 21 are mounted for bringing mounted wafers 21 into close contact with upper surfaces of surface plates 10a to 10d, respectively, and supply tubes 50a to 50d for supplying solution 40 and slurry 30 onto the upper surfaces of surface plates 10a to 10d.

In the polishing apparatus configured as described above, wafers 21 mounted on head portions 60a to 60d are brought into close contact with surface plates 10a to 10d on which fixed abrasive pads 11 or urethane pads 12 are mounted. In this state, solution 40 or slurry 30 is supplied from supply tubes 50a to 50d to the upper surfaces of surface plates 10a to 10d. Surface plates 10a to 10d are rotated at a predetermined speed to polish surfaces of wafers 21.

Next, the states of the wafers in the aforementioned polishing steps are described.

Figure 6A:
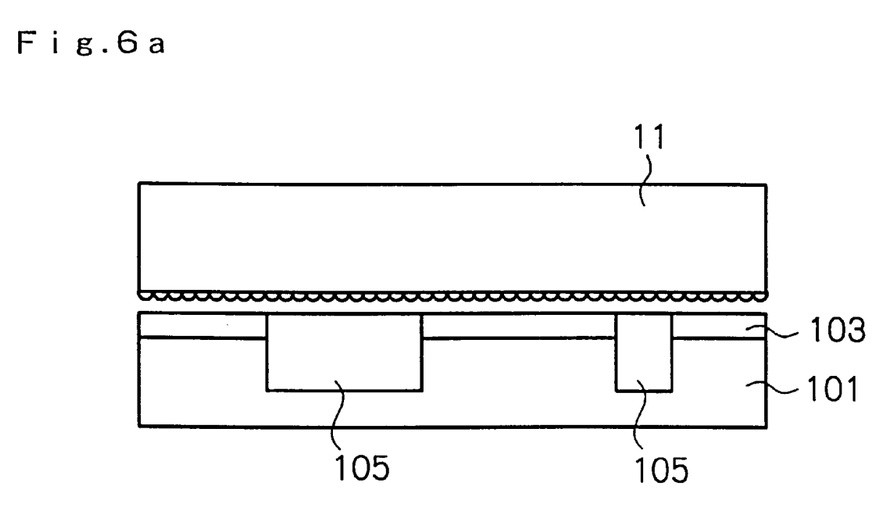

As shown in FIG. 6a, in the primary polishing step, since solution 40 contains no free abrasive and fixed abrasive pad 11 is hard, polishing is performed with high flatness and extremely less dishing and erosion. However, many scratches occur on the polished surface of wafer 21 since solution 40 contains no free abrasive and fixed abrasive pad 11 is hard.

Thus, many scratches remain on the surface of wafer 21 if both primary polishing step and secondary polishing step are performed using the method shown in FIG. 4a. In addition, a slow polishing speed in the method shown in FIG. 4a results in much time taken for the polishing steps. Furthermore, high friction between wafer 21 and fixed abrasive pad 11 may cause wafer 21 to escape from support member 20 during the polishing.

For these reasons, the secondary polishing is performed using urethane pad 12 and slurry 30 as shown in FIG. 4b.

Figure 6B:
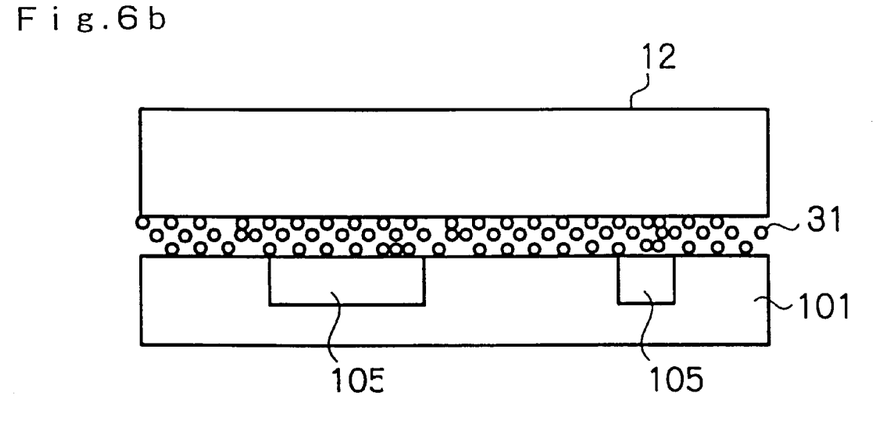
FIG. 6b is a diagram showing the state of the wafer in the secondary polishing step for a semiconductor device shown in FIG. 4b.

In the secondary polishing step, as shown in FIG. 6b, since slurry 30 contains free abrasives 31 and urethane pad 12 is soft, the scratches produced in the primary polishing step can be reduced. This can prevent deteriorated electromigration characteristics caused by the scratches.

Figure 7A:
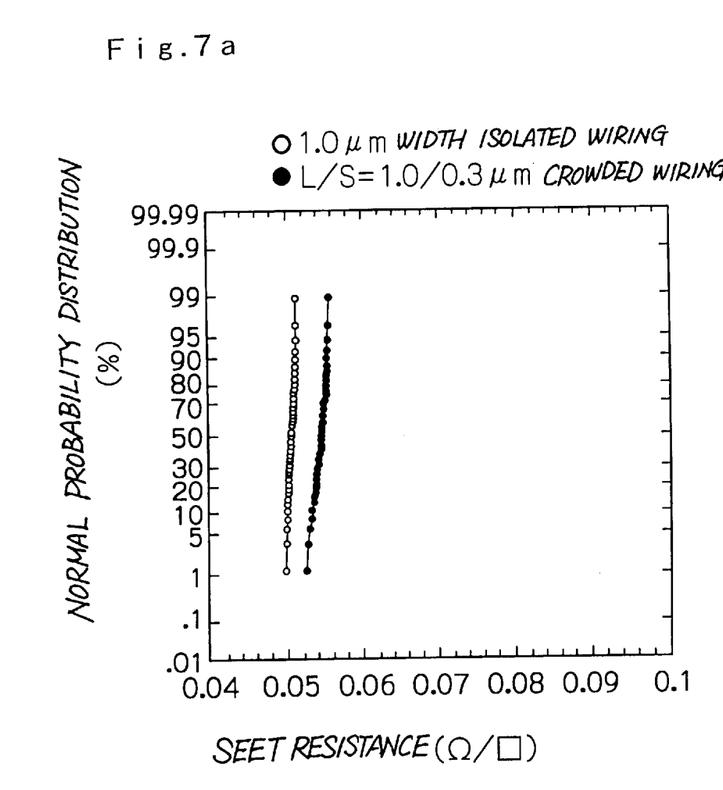
FIG. 7a is a graph showing the sheet resistance distribution of the wafer polished in the polishing steps shown in FIGS. 4a, 4b.
Figure 7B:
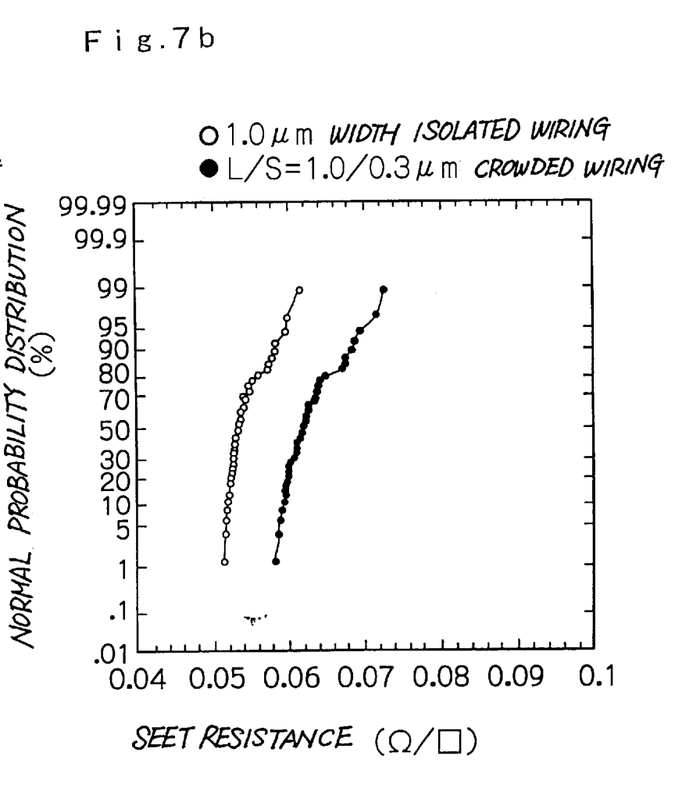
FIG. 7b is a graph showing the sheet resistance distribution of the wafer polished in the polishing step shown in FIG. 2.

FIG. 7a shows the sheet resistance distribution of the wafer polished in the polishing steps shown in FIGS. 4a, 4b, while FIG. 7b shows the sheet resistance distribution of the wafer polished in the polishing step shown in FIG. 2.

As apparent from the comparison of FIG. 7a and FIG. 7b, wiring resistance values vary greatly in the wafer polished in the polishing step shown in FIG. 2. On the other hand, variations in wiring resistance are significantly small in the wafer polished in the polishing steps shown in FIGS. 4a, 4b.

This is because the erosion and dishing are reduced in the wafer polished in the polishing steps shown in FIGS. 4a, 4b as compared with the wafer polished in the polishing step shown in FIG. 2.

Second Embodiment

The primary polishing step and secondary polishing step in the aforementioned method of fabricating a semiconductor device can be performed using the same pad.

Figure 8:
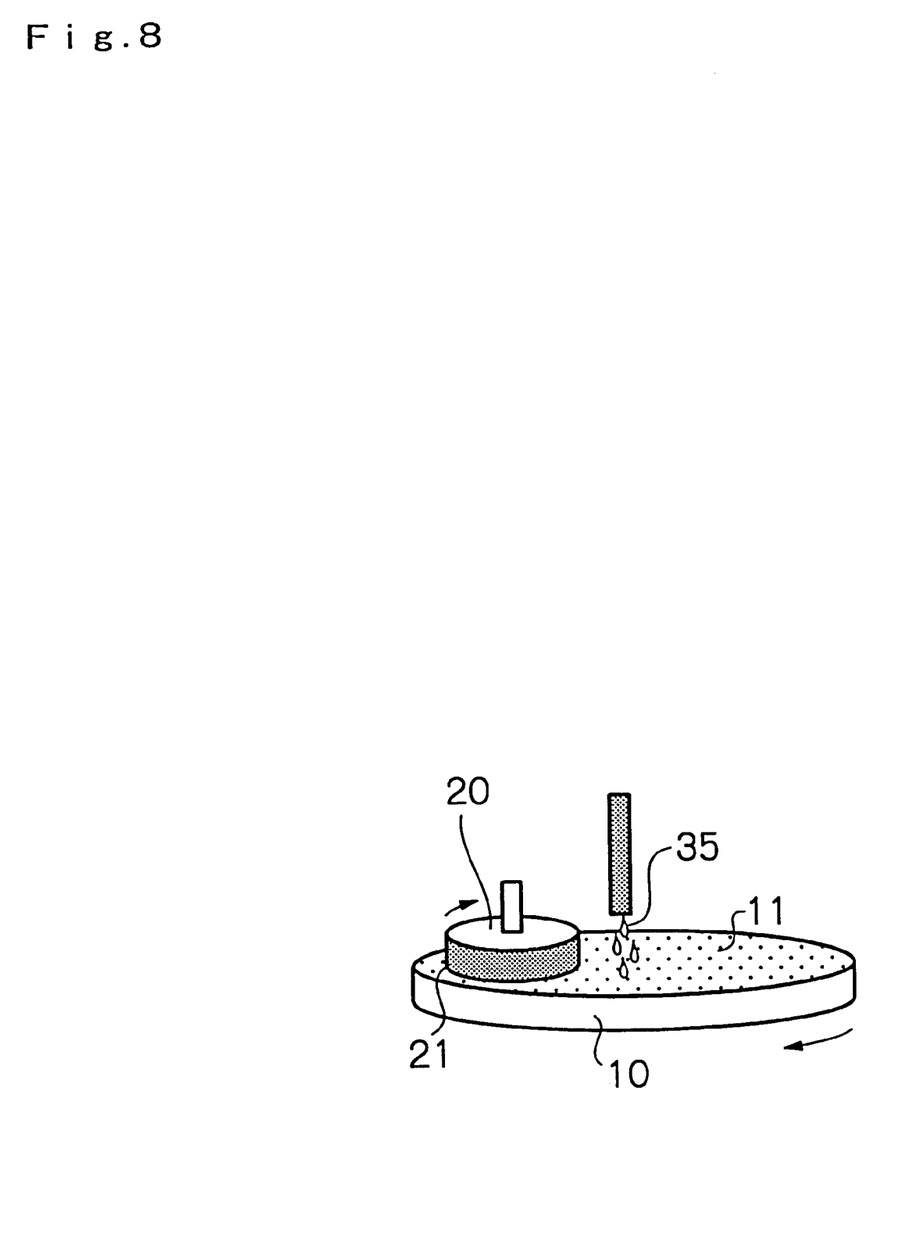
FIG. 8 is a diagram showing a second embodiment of the method of fabricating a semiconductor device of the present invention.

As shown in FIG. 8, in a second embodiment, in the first place, support member 20 on which wafer 21 is mounted is brought into close contact with surface plate 10 having an upper surface on which fixed abrasive pad 11 including abrasives embedded therein is mounted such that fixed abrasive pad 11 is in contact with wafer 21. In this state, surface plate 10 is rotated while slurry 35 containing free abrasives made of alumina is supplied onto fixed abrasive pad 11 to polish a surface of wafer 21 until a barrier layer is exposed (primary polishing step). At this point, support member 20 also is rotated on the axis.

The amount of the free abrasives contained in slurry 35 supplied onto fixed abrasive pad 11 in the primary polishing step is equal to or lower than 0.8% by weight.

Next, surface plate 10 is rotated while slurry 35 containing free abrasives made of silica is supplied onto fixed abrasive pad 11 to polish the surface of wafer 21 (secondary polishing step). At this point, support member 20 also is rotated about the axis. The amount of the free abrasives contained in slurry 35 supplied onto fixed abrasive pad 11 in the secondary polishing step also is equal to or lower than 0.8% by weight.

In the aforementioned polishing process, slurry 35 containing the free abrasives is supplied onto fixed abrasive pad 11 including the abrasives embedded therein to polish the wafer. However, since the amount of the free abrasives contained in slurry 35 is equal to or lower than 0.8% by weight, the amount of the free abrasives are introduced into concave portions in the surface of wafer 21 can be reduced to suppress further digging of the concave portions.

While preferred embodiments of the present invention have been described using specific terms, such description is for illustrative purpose only, and it is to be understood that changes and variations may be made without departing from the sprit or scope of the following claims.

What is claimed is:

1. A method of fabricating a semiconductor device using chemical mechanical polishing, comprising the steps of:
   forming grooves in a substrate;
   depositing a conductive layer on said substrate in which said grooves are formed; and
   removing said conductive layer except for its portions on said grooves by polishing,
   wherein said removing step comprises:
   a primary polishing step of bringing said substrate into close contact with a first pad including abrasives and made of a hard material, and rotating said first pad while a first solution containing no abrasive is supplied onto said first pad to polish a surface of said substrate; and
   a secondary polishing step of bringing said substrate into close contact with a second pad including no abrasive and made of a soft material, and rotating said second pad while a second solution containing abrasives is supplied onto said second pad to polish the surface of said substrate.

2. The method of fabricating a semiconductor device according to claim 1, wherein said conductive layer except for the portions on said grooves is removed in said primary polishing step until at least part of said substrate is exposed.

3. The method of fabricating a semiconductor device according to claim 1, wherein said conductive layer except for the portions on said grooves is removed in said primary polishing step.

4. The method of fabricating a semiconductor device according to claim 1, wherein said first solution is a liquid containing an organic acid.

5. The method of fabricating a semiconductor device according to claim 2, wherein said first solution is a liquid containing an organic acid.

6. The method of fabricating a semiconductor device according to claim 3, wherein said first solution is a liquid containing an organic acid.

7. The method of fabricating a semiconductor device according to claim 1, wherein said second solution is slurry containing silica.

8. The method of fabricating a semiconductor device according to claim 2, wherein said second solution is slurry containing silica.

9. The method of fabricating a semiconductor device according to claim 3, wherein said second solution is slurry containing silica.

10. The method of fabricating a semiconductor device according to claim 4, wherein said second solution is slurry containing silica.

11. The method of fabricating a semiconductor device according to claim 5, wherein said second solution is slurry containing silica.

12. The method of fabricating a semiconductor device according to claim 6, wherein said second solution is slurry containing silica.

13. The method of fabricating a semiconductor device according to claim 1, wherein said second pad is an urethane pad.

14. The method of fabricating a semiconductor device according to claim 2, wherein said second pad is an urethane pad.

15. The method of fabricating a semiconductor device according to claim 3, wherein said second pad is an urethane pad.

16. The method of fabricating a semiconductor device according to claim 4, wherein said second pad is an urethane pad.

17. The method of fabricating a semiconductor device according to claim 5, wherein said second pad is an urethane pad.

18. The method of fabricating a semiconductor device according to claim 6, wherein said second pad is an urethane pad.

19. The method of fabricating a semiconductor device according to claim 7, wherein said second pad is an urethane pad.

20. The method of fabricating a semiconductor device according to claim 8, wherein said second pad is an urethane pad.

21. The method of fabricating a semiconductor device according to claim 9, wherein said second pad is an urethane pad.

22. The method of fabricating a semiconductor device according to claim 10, wherein said second pad is an urethane pad.

23. The method of fabricating a semiconductor device according to claim 11, wherein said second pad is an urethane pad.

24. The method of fabricating a semiconductor device according to claim 12, wherein said second pad is an urethane pad.

25. A method of fabricating a semiconductor device, comprising the steps of:

forming grooves in a substrate;

depositing a conductive layer on said substrate in which said grooves are formed; and removing said conductive layer except for its portions on said grooves by bringing said substrate into close contact with a pad including abrasives and rotating said pad while a solution containing abrasives is supplied onto said pad to polish a surface of said substrate, wherein the amount of the abrasives contained in said solution is equal to or lower than 0.8% by weight.

26. The method of fabricating a semiconductor device according to claim 25, wherein said removi step includes:

a primary polishing step of polishing the surface of said substrate using slurry containing abrasives made of alumina as said solution; and a secondary polishing step of polishing the surface of said substrate using slurry containing abrasives made of silica as said solution.

27. The method of fabricating a semiconductor device according to claim 26, wherein said conductive layer except for the portions on said grooves is removed in said primary polishing step until at least part of said substrate is exposed.

28. The method of fabricating a semiconductor device according to claim 26, wherein said conductive layer except for the portions on said grooves is removed in said primary polishing step.

* * * * *